United States Patent
Blaesing-Bangert et al.

(10) Patent No.: US 9,528,825 B2
(45) Date of Patent: Dec. 27, 2016

(54) METHOD FOR CALIBRATING A POSITION-MEASURING SYSTEM AND POSITION-MEASURING SYSTEM

(71) Applicants: Carl Zeiss SMS GmbH, Jena (DE); Carl Zeiss SMT GmbH, Oberkochen (DE)

(72) Inventors: Carola Blaesing-Bangert, Rothenstein (DE); Alexander Huebel, Aalen (DE)

(73) Assignee: Carl Zeizz SMT GmbH, Oberkochen (DE)

( * ) Notice: Subject to any disclaimer, the term of this patent is extended or adjusted under 35 U.S.C. 154(b) by 276 days.

(21) Appl. No.: 14/327,634

(22) Filed: Jul. 10, 2014

(65) Prior Publication Data
US 2015/0013427 A1    Jan. 15, 2015

(30) Foreign Application Priority Data
Jul. 10, 2013    (DE) .................. 10 2013 213 525

(51) Int. Cl.
*G01B 9/02* (2006.01)
*G01B 21/16* (2006.01)
*G03F 7/20* (2006.01)

(52) U.S. Cl.
CPC .......... *G01B 21/16* (2013.01); *G01B 9/02072* (2013.04); *G03F 7/70516* (2013.01); *G03F 7/70775* (2013.01); *G03F 7/70858* (2013.01)

(58) Field of Classification Search
CPC ....... G01B 9/02; G01B 9/02072; G01B 21/16; G03F 7/70858; G03F 7/70775; G03F 7/70516
See application file for complete search history.

(56) References Cited

U.S. PATENT DOCUMENTS

| | | | |
|---|---|---|---|
| 4,998,821 A * | 3/1991 | Ohta | G03F 7/70241 353/101 |
| 7,310,130 B2 | 12/2007 | Eussen et al. | |
| 7,978,340 B2 | 7/2011 | Boesser et al. | |
| 2006/0221344 A1* | 10/2006 | Masuda | G01J 9/0246 356/451 |
| 2006/0279743 A1* | 12/2006 | Boesser | G01B 9/0207 356/500 |

(Continued)

FOREIGN PATENT DOCUMENTS

| | | | |
|---|---|---|---|
| DE | 4208189 | 4/1993 | ............... G01B 9/02 |
| DE | 19628969 C1 * | 10/1997 | ......... G01B 9/02058 |

(Continued)

OTHER PUBLICATIONS

Laser and Optics User's Manual, Chapter 71, Agilent 10717A Wavelength Tracker, pp. 71-1-71-16 (2002).

*Primary Examiner* — Nguyen Ha
(74) *Attorney, Agent, or Firm* — Fish & Richardson P.C.

(57) ABSTRACT

A method is provided for calibrating a position-measuring system which includes the following steps: a) multiple measurements of positions of a structure of a sample held by a sample stage at different pressures of the gaseous medium in which the sample stage is arranged, b) ascertaining the pressure dependence when determining actual positions by use of an evaluation unit, c) establishing a calibration rule based on the ascertained pressure dependence, and d) applying the calibration rule when determining the actual positions.

19 Claims, 1 Drawing Sheet

(56) References Cited

U.S. PATENT DOCUMENTS

| | | | | |
|---|---|---|---|---|
| 2007/0146661 A1* | 6/2007 | Eussen | ............... | G03F 7/70516 |
| | | | | 355/30 |
| 2007/0268496 A1* | 11/2007 | Boesser | ............. | G03F 7/70775 |
| | | | | 356/508 |
| 2008/0137097 A1* | 6/2008 | Tanaka | ............... | G03F 7/70858 |
| | | | | 356/509 |
| 2009/0031572 A1* | 2/2009 | Boesser | .............. | G01B 11/005 |
| | | | | 33/503 |
| 2009/0033508 A1* | 2/2009 | Boesser | .............. | G01B 11/005 |
| | | | | 340/626 |
| 2010/0268499 A1* | 10/2010 | Holzapfel | ......... | G01B 9/02027 |
| | | | | 702/76 |
| 2013/0250307 A1* | 9/2013 | Tamiya | ............. | G01B 9/02015 |
| | | | | 356/498 |

FOREIGN PATENT DOCUMENTS

| | | | | |
|---|---|---|---|---|
| DE | 102008030153 | 12/2009 | ............ | G01B 11/03 |
| DE | 102007036813 | 12/2010 | | |
| JP | 2903958 B2 * | 6/1999 | ........ | G06F 7/70691 |

* cited by examiner

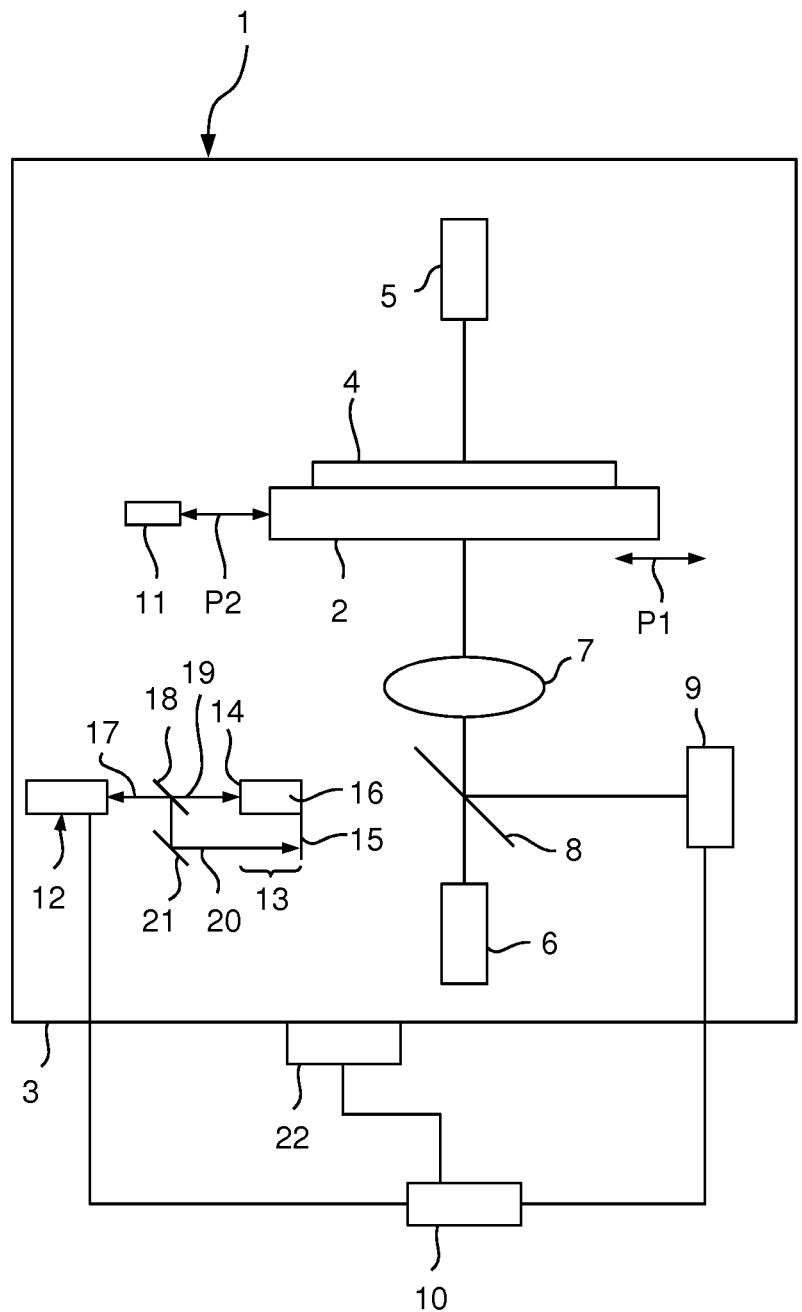

METHOD FOR CALIBRATING A POSITION-MEASURING SYSTEM AND POSITION-MEASURING SYSTEM

CROSS-REFERENCE TO RELATED APPLICATIONS

This application claims priority to German application 102013213525.4, filed on Jul. 10, 2013, the entire contents of which are hereby incorporated by reference.

BACKGROUND OF INVENTION

The present invention relates to a method for calibrating a position-measuring system and a position-measuring system for detecting a position.

Such position-measuring systems are, for example, used in the field of metrology in order, e.g., to measure structures on a wafer or structures of a mask for producing semiconductor elements. For this, e.g., an image of a structure on a sample is recorded, then the sample (e.g., wafer or mask) moves and the image of a second structure on the sample is recorded. Then, for example, the distance between the two structures as well as a movement distance of the sample can be determined from the images.

Accuracy of such measuring systems must be improved as the structures on the sample becoming steadily smaller. In order to meet these requirements, a movement of the sample may be measured by use of interferometry. Accuracy of the position measurement by the use of interferometry depends on the refractive index of the gaseous medium (e.g., ambient air) in which the sample is arranged. As conventional sensors for determining air pressure and temperature are used, the refractive index of the gaseous medium is continually determined, typically with a known reference section (etalon). To this end, the refractive index is calculated from the changes, measured by use of interferometry, in etalon length signal and known etalon length, and the measured positions are corrected accordingly.

Furthermore, it is known to regulate environmental parameters such as, e.g., temperature, pressure and atmospheric humidity in the measuring area in order to achieve the most constant conditions possible.

However, all these measures are not sufficient to achieve the measurement precision desired when determining the position.

SUMMARY OF INVENTION

In general, an aspect of the invention is to provide a method for calibrating a position-measuring system, and a position-measuring system, which make possible to improve measuring accuracy.

A method for calibrating a position-measuring system is provided. The measuring system includes a measuring area filled with a gaseous medium; a sample stage for holding a sample, which sample stage can be moved at least in one direction and is arranged in the measuring area; an optical system arranged in the measuring area, which system records the structure of a held sample and produces corresponding first measuring signals; a first measuring system which is arranged in the measuring area, measures, by use of interferometry, the movement of the sample stage in the at least one direction and produces corresponding second measuring signals; a second measuring system which measures a change in distance corresponding to a change in pressure of the gaseous medium in the measuring area and produces corresponding third measuring signals; and an evaluation unit which, based on the first, second and third measuring signals, determines the position of a recorded structure, wherein the third measuring signals serve to reduce a measuring error occurring when the pressure of the gaseous medium changes during interferometric measurement of the movement of the sample stage. The calibrating method includes the following steps: a) multiple measurements of a structure of a sample held by the sample stage at different pressures of the gaseous medium, b) ascertaining the pressure dependence when determining actual positions by use of an evaluation unit, c) establishing a calibration rule based on the ascertained pressure dependence, and d) applying the calibration rule when determining the actual positions by use of the evaluation unit and/or when producing the first, second and/or third measuring signals, in order to reduce the pressure dependence when determining the actual positions.

Implementations of the invention may include one or more of the following aspects. The influence of the change in pressure on components of the measuring section is taken into account when determining the position. This leads to the desired increase in measuring accuracy when determining the position. In particular it is not necessary to control the pressure in the measuring area. Indeed, this may, but need not, be carried out with the position-measuring system according to the invention. If such a pressure regulation is dispensed with, the position-measuring system can be produced more cost-effectively but also still have a very high measuring accuracy.

Atmospheric-pressure-induced influences on determining the position can also be taken into account with the method according to the invention, which influences are not produced by changes in the refractive index. Thus, e.g., large fluctuations in pressure can lead to errors in scaling/measurement because of compression of materials of components involved in measurement, such as e.g. the sample, the measuring section, the sample stage measurement mirror, etc. Conventionally, methods of calculating pressure-induced changes in shape of components involved in the measuring circuit, e.g., by use of the finite elements method, and storing an executing program in a control unit, known thus far, are very costly and also require that most or all components are sufficiently precisely known, which is generally not the case.

These difficulties can be overcome by the calibrating method according to one or more aspects of the invention.

With the method described above, in step b) a linear approximation of the measured positions, depending on the pressure, can be determined as pressure dependence and in step c) as calibration rule there can be established a proportionality factor which is determined such that the pressure dependence is reduced. Thus, for example from the measured positions and the corresponding pressures, an average proportionality factor can be established.

In the method, the second measuring system can have a measuring section with a constant length through the gaseous medium (e.g., in the measuring area or in an area connected thereto) and, for measuring the change in pressure, detect the interference of a measuring beam passing through the measuring section and a measuring beam not passing through the measuring section. In particular, the second measuring system can be designed as a differential interferometer.

The calibration rule can arithmetically change the length of the measuring section to be taken into account while determining the change in pressure. That is, a coefficient of correction is taken into account numerically in that, when determining the position, not the actual length of the measuring section but a corresponding length longer or shorter than the actual length of the measuring section is used in corresponding calculations.

In particular, several structures can be measured several times in step a) and the distance between structures can be determined in step b).

Furthermore, with the method according to an aspect of the invention, the temperature and/or the relative moisture of the gaseous medium can be controlled in the measuring area such that a predetermined constant value is maintained.

As the temperature and moisture (or humidity) in the measuring area can be regulated very precisely, changes in pressure then make up the largest proportion of changes to the refractive index (>90%). The pressure-dependent deformations, to be expected, of the involved components proceed proportionally to the change in pressure in the first approximation. Thus, a constant coefficient of correction can be ascertained as calibration rule in the first approximation.

Naturally it is possible to ascertain a correction function for example as calibration rule.

Furthermore, a device for carrying out the method according to an aspect of the invention (including the development thereof) is provided, wherein the device has a measuring area filled with a gaseous medium; a sample stage for holding a sample, which sample stage can be moved at least in one direction and is arranged in the measuring area; an optical system arranged in the measuring area, which system records positions of the structure of a held sample and produces corresponding first measuring signals; a first measuring system which is arranged in the measuring area, measures, by use of interferometry, movement of the sample stage in the at least one direction and produces corresponding second measuring signals; a second measuring system which measures a change in distance corresponding to a change in pressure of the gaseous medium in the measuring area and produces corresponding third measuring signals; and an evaluation unit which, based on the first, second and third measuring signals, determines a position of a recorded structure, wherein the third measuring signals serve to reduce a measuring error occurring when the pressure of the gaseous medium changes during the interferometric measuring of the movement of the sample stage.

According to another aspect of the invention, a position-measuring system is provided. The system includes a measuring area filled with a gaseous medium; a sample stage for holding a sample, which stage can be moved at least in one direction and is arranged in the measuring area; an optical system arranged in the measuring area, which system records positions of a structure of a held sample and produces corresponding first measuring signals; a first measuring system which is arranged in the measuring area, measures, by use of interferometry, movement of the sample stage in the at least one direction and produces corresponding second measuring signals; a second measuring system which measures a change in distance corresponding to a change in the pressure of the gaseous medium in the measuring area and produces corresponding third measuring signals; an evaluation unit which, based on the first, second and third measuring signals, determines a position of a recorded structure, wherein the third measuring signals serve to reduce a measuring error occurring when the pressure of the gaseous medium changes during the interferometric measuring of the movement of the sample stage. The system includes a control unit that carries out the following steps: a) multiple measurements of positions of a structure of a sample held by the sample stage at different pressures of the gaseous medium, b) ascertaining the pressure dependence when determining an actual position by use of an evaluation unit, c) establishing a calibration rule based on the ascertained pressure dependence, and d) applying the calibration rule when determining the actual position by use of the evaluation unit and/or when producing the first, second and/or third measuring signals, in order to reduce the pressure dependence when determining the actual position.

The position-measuring system according to an aspect of the invention can be developed such that the method according to the aspect of the invention for calibrating a position-measuring system, including the described developments, can be carried out by said system.

The measuring section can be provided by two mirrors, spatially separated from each other, wherein the two mirrors are spatially separated from one another in particular by a spacer. They can be connected to the spacer. The spacer can be produced from a material which has very low dimensional changes when subjected to changes in temperature and/or pressure. In particular, the material Zerodur can be used.

Even if using such a material, it has been shown that the still present changes in expansion, depending on the changes in pressure, lead to a deterioration in the desired measuring accuracy. Therefore, taking into account pressure-induced changes in length of the measuring section when determining the position leads to high measuring accuracy.

Preferably, the second measuring system measures the interference (in particular the phase change) of the two measuring beams continually.

The evaluation unit can take into account a factor of correction as calibration rule when determining the position of the structure, which factor shows or represents the change in length of the measuring section induced by the change in pressure in the measuring area. This can in particular be the changed length of the measuring section. This changed length of the measuring section can be called effective length and, when determining the position, it can be assumed that the measuring section has this effective length.

Errors in scaling can be ascertained in step b) in particular for determining the calibration rule. It has been established that there is in particular a linear dependence of the change in measured scalings on the third measuring signals. Therefore, e.g., a straight line can be fitted to the scaling values and the gradient of the fitted straight line used when ascertaining the calibration rule (e.g., the factor of correction).

Furthermore, the position-measuring system according to an aspect of the invention can have a regulating module which regulates the temperature and/or the relative moisture of the gaseous medium in the measuring area such that a predetermined constant value is maintained. This leads to an increase in measuring accuracy.

The second measuring system can be developed in particular as a differential interferometer.

Furthermore, the position-measuring system according to an aspect of the invention can be developed as a metrology system.

The position-measuring system according to an aspect of the invention can have further elements known to a person skilled in the art which are useful for operating the position-measuring system. Furthermore, the position-measuring system can determine the position of the object relative to a fixed position.

The method according to the one or more aspects of the invention can be developed such that it has the method steps described in connection with the position-measuring system according to the one or more aspects of the invention (including developments thereof).

It is understood that the features mentioned above and those yet to be explained below can be used, not only in the stated combinations, but also in other combinations or alone, without departing from the scope of the present invention.

Subsequently, the invention is explained in more detail, for example with the help of the attached drawing, which also discloses features useful to the invention.

BRIEF DESCRIPTION OF DRAWING

FIG. 1 shows a schematic representation of an embodiment of a position-measuring system.

DETAILED DESCRIPTION

Referring to FIG. 1, in some implementations, a position-measuring system 1 includes a stage 2 which can be moved at least in one direction, which stage is arranged in a measuring area 3 in which a gaseous medium is present. The stage 2 bears a mask 4 to be examined, which mask is illuminated either by a first illumination device 5 for transillumination or a second illumination device 6 for incident illumination. The illumination device 5, 6 can for example each be developed as a laser which emits light with a wavelength of 193 nm.

The illuminated mask 4 is imaged via imaging optics 7 and a beam splitter 8 on an image sensor 9 (which for example is developed as a CCD sensor or as a CMOS sensor), which together can also be called recording unit or optical system. The image sensor 9 is connected to a control unit 10 arranged outside the measuring area 3 and said image sensor transmits the image signals to said control unit as first measuring signals.

In order to detect the movement of the stage 2 in the first direction which is shown by the double-headed arrow P1, a first measuring system 11 is provided which detects, by use of interferometry as shown by the double-headed arrow P2, the movement of the stage 2 in the first direction P1. The corresponding measuring signals are supplied to the control unit 10 as second measuring signals.

Furthermore, a second measuring system 12 is arranged in the measuring area 3, which system is developed as a differential interferometer, which has a measuring section 13 of constant length. Here, the measuring section 13 is the distance between a first and a second mirror 14, 15, wherein the distance between the two mirrors 14, 15 is fixed by a spacer 16 and known. The spacer 16 can for example be produced from Zerodur.

As shown schematically in FIG. 1, a laser beam 17 is divided at a first beam splitter 18 into a first and second measuring beam 19, 20, wherein the first measuring beam 19 strikes the first mirror 14 and the second measuring beam 20 strikes the second mirror 15 via a reflecting mirror 21. The second measuring beam 20 thus passes through the measuring section 13 (here twice), whereas the first measuring beam 19 does not pass through the measuring section 13.

During operation of the position-measuring system 1, difficulty arises that a change in pressure of the gaseous medium inside the measuring area 3 leads to a change in refractive index of the gaseous medium in the measuring area 3, which leads to an error when determining position by use of the first measuring system 11, as the measuring section of the first measuring system 11 passes through the gaseous medium. In the second measuring system 12, the change in refractive index induced by the change in pressure leads to third measuring signals which are supplied to the control unit 10, because the measuring section 13 likewise passes through the gaseous medium.

The third measuring signals show a change in the optical path of the measuring section 13 which is composed from the product of refractive index of the gaseous medium and geometric path of the measuring section. As the geometric path EL of the measuring section 13 is not changed, and therefore stays just as large, every change in the optical path $\Delta\phi$ (every change to the interferometer) reflects corresponding changes to the refractive index $\Delta\phi=\Delta(n\cdot EL)=\Delta n\cdot EL$, wherein n is the refractive index and $\Delta n$ is the change in refractive index. From an initial value n0 at the start of the measurements by the second measuring system 12 and the subsequent change over time t, the current refractive index can thus be calculated as follows $n(t)=n0+\Delta n(t)=n0+\Delta\phi(t)/EL$. The length EL is measured and is available to the control unit 10.

It has been shown that with very high measuring accuracies, overly high imprecisions, which are caused by pressure-induced changes in length of the components (such as, e.g. stage 2, mask 4 and imaging optics 7) involved on the measuring circuit, are still present when determining the position, despite taking into account the change in refractive index which is ascertained by the second measuring system 12.

Therefore, the control unit 10 is designed such that it likewise takes into account, e.g., due to the change in length of the working section 13, brought about by the change in pressure, when the position of the sample stage 2 is being determined. Thus, the measuring accuracy can be further increased.

Depending on the change in pressure in the measuring area 3, in particular the influence of the change in measuring section 13 can be taken into account by a coefficient of correction which is to be determined for a position-measuring system 1 present and can then be taken into account when determining the position of the sample stage 2. Determining such a coefficient of correction is described below.

The reference section being the spacer 16 for the two mirrors 14, 15 is called etalon. In preparation, the length of the etalon ($l_{E0}$) is measured accurately to a few μm, e.g., with a coordinate measuring machine.

The expected length ($l_E$) of the measuring section 13 during the change in pressure can be indicated with the following formula 1:

$$l_E=l_{E0}\cdot[1-\epsilon_E\cdot(p-p_0)], \tag{1}$$

wherein $p_0=1,013.25$ mbar, p is the present pressure, $l_{E0}$ the expected length of the measuring section 13 at pressure $p_0$ and $\epsilon_E\approx 5.73\cdot 10^{-10}$ mbar$^{-1}$. The value $\epsilon_E$ describes the pressure-dependent compression of the spacer 16, wherein the indicated value $\epsilon_E$ has been ascertained by a FEM (FEM refers to finite element method) calculation. The value of $\epsilon_E$ can be assessed also without FEM calculation, with the help of the elastic constants of the material Zerodur of the spacer 16 according to formula 2 below.

$$\text{Modulus of elasticity } E \approx 9\cdot 10^{10}\frac{N}{m^2} \tag{2}$$

$$\text{Poisson number } \mu \approx 0.243$$

$$\Rightarrow \epsilon_E \approx \frac{1-2\mu}{E} \approx 5.7(1)\cdot 10^{-10} \text{ mbar}^{-1}$$

However, the length of the measuring section 13 is not sufficiently accurately known under standard conditions, as the length is determined mechanically by a corresponding measuring device. The real length $\tilde{l}_E$ can be indicated according to the formula 4 below $$\tilde{l}_E = l_{E0} - \Delta l_{E0} \qquad (3)$$

wherein $\Delta l_{E0}$ indicates the measuring accuracy with a mechanical measurement of the measuring section 13 and a specific value is indicated for a real position-measuring system 1. Furthermore, the value of $\epsilon_E$ is not sufficiently accurately known.

In the below equation 4 it is indicated how the measured refractive index ñ depends on all parameters ($\tilde{n}_R$ is the measured refractive index at last referencing and $\Delta \phi_E$ is the phase difference of the etalon since the last referencing).

$$\tilde{n} = \tilde{n}_R + \frac{\lambda_0}{2\pi} \cdot \frac{\Delta \varphi_E}{\tilde{l}_E} = \tilde{n}_R + \frac{l_E \cdot n - l_{ER} \cdot n_R}{l_{E0} - \Delta l_{E0}} \qquad (4)$$

$$= \tilde{n}_R + \frac{l_{E0} \cdot n(p, T, \ldots) \cdot [1 - \varepsilon_E \cdot (p - p_0)] - l_{ER} \cdot n_R}{l_{E0} - \Delta l_{E0}}$$

If all parameters were known, the measuring problem could be regarded as solved. But this is not the case. However, the uncertainty factors (length under normal conditions as well as compression factor) in the first approximation have the same effect, as an etalon which is compressed by pressure air behaves exactly the same as a non-compressible etalon of a different length. Assuming that $\epsilon_E$ is very small and assuming that $\partial n/\partial p \approx 2.66 \cdot 10^{-7}$ mbar$^{-1}$, the following can be indicated for the effective length $l_{\textit{eff}}$ $$l_{\textit{eff}} = \left(1 - \frac{n \cdot \varepsilon_E}{\partial n / \partial p}\right) \cdot l_{E0} \approx \left(1 - \frac{\varepsilon_E}{\partial n / \partial p}\right) \cdot l_{E0} \qquad (5)$$

This approximation is valid because $\epsilon_E$ is very small for a large pressure range (the error of approximation is less than 10% for a range from 900 to 1,050 mbar).

Thus, starting from an initial value $\tilde{n}_R$ the refractive index can be indicated as follows ($\lambda_0$ is the vacuum wavelength of the laser beam 17):

$$n' = \tilde{n}_R + \frac{\lambda_0}{2\pi} \cdot \frac{\Delta \varphi_E}{l_{\textit{eff}}} \qquad (6)$$

Naturally, a change in pressure of the medium in the measuring chamber 3 also leads to a compression of the mask 4 This compression can be taken into account also via determinations of the effective length $l_{\textit{eff}}$ of the measuring section 13. As a rule, the compression effect of the mask 4 counteracts the compression effect of the measuring section 13. However, there remains a difference which is smaller than both individual corrections. The following numerical values can be indicated for the mask 4, e.g., from modulus of elasticity $E_R$ and Poisson number $\mu_R$:

$$\varepsilon_R \approx \frac{1 - 2\mu_R}{E_R} \qquad (7)$$

A more accurate value can be obtained from an FEM calculation.

The effective length of the measuring section 13 or the effective etalon length, which takes into account etalon and mask compression, can then be indicated as follows (the numerical value relates in turn to the observed real position-measuring system)

$$l'_{\textit{eff}} \approx \left(1 + \frac{\varepsilon_R - \varepsilon_E}{\partial n / \partial p}\right) \cdot l_{E0} \qquad (8)$$

Naturally, further changes to the position-measuring system which are caused by the change in pressure of the medium in the measuring area 3, can also be taken into account. Thus, e.g., the dimensions of the stage 2 as well as further components in the measuring chamber 3, such as e.g. the imaging optics 7, can be changed.

The pressure dependence of the further components leads in turn to a measuring error when determining the position of the stage 2. This dependence can, in the same way, be taken into account as a coefficient of correction when determining the pressure-dependent refractive index by the second measuring system 12. However, these effects can practically barely or no longer be determined analytically or by approximation computations.

With the coefficient of correction for all components in measuring range of the position-measuring system 1, positions of structures on the mask 4 can be measured at different pressures which occur during a measuring period. With such a position measurement, e.g., a dimensioning of the structures or a distance between at least two structures on the mask 4 can be ascertained.

As the coefficient of correction behaves like an effective change in length of the reference section 13, the coefficient of correction itself can be determined empirically from the measurements on the respective measuring system. In particular it has been established that a change in the measured dimensions or the measured distance (also called enlargement hereinafter) is linear depending on the changes in the third measuring signals of the second measuring system 12 or of the measured pressure dependence. The correction value can then be calculated from the gradient of a fitted straight line with regard to these measurement values. The correction value is calculated such that the change in the measured dimension or measured distance is as independent as possible on the measuring signals of the second measuring system 12. With this procedure, measuring errors not only based on pressure dependence, but all errors in scaling based on the refractive index, are corrected automatically.

The position-measuring system is designed in particular as a metrology system which can be used for measuring lengths or for measuring distances. If the mask 4 contains, e.g., two distinguishing markings, and the distance between them is to be measured, then a recording of each of the markings is carried out by use of the imaging optics 7 and the recording sensor 9. For each recording, the corresponding marking is moved into a recording area which is predetermined by the imaging optics 7 and the recording sensor 9, in which a desired distance can be ascertained with great precision from the recordings in connection with the measured travel path which is detected in the described manner by use of the two measuring systems 11 and 12.

The position-measuring system can also have a regulating module 22 which regulates the temperature and/or the relative humidity in the measuring area 3 such that these are kept as constant as possible. Thus, the regulating module 22 can regulate the temperature with an accuracy of, e.g., ≤0.01° C. and the relative moisture with an accuracy of, e.g., ≤1%. The regulating module 22 can be connected to the control unit 10.

The stage 2 can also be moved in two directions perpendicular to one another (e.g., in the direction of the double-headed arrow P1 as well as perpendicular to the plane of the drawing). In this case, the first measuring system 11 is designed such that it measures, by use of interferometry, the movement in both directions.

Alternatively or additionally to the movement of the sample stage 2, the recording unit (imaging optics 7, beam splitter 8 and sensor 9) can be moved relative to the stage 2. In this case, the movement of the recording unit would then be measured, by use of interferometry, using the first measuring system.

The second measuring system 12 can, as described, be arranged in the measuring area 3. However, it is also possible that the second measuring system 12 is arranged in a separate area which, however, is connected to the measuring area 3 such that the same conditions and in particular the same pressure as in the measuring area 3 are present there.

The first and second illumination device 5, 6 is drawn in the embodiment of the position-measuring system 1, shown in FIG. 1. Naturally, the position-measuring system need not have two illumination devices 5, 6. It may also include merely one of the two illumination devices 5, 6.

The features described above related to processing of data, e.g., according to one or more of Formulas 1 to 8, can be implemented in digital electronic circuitry, or in computer hardware, firmware, software, or in combinations of them. The features can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or in addition, the program instructions can be encoded on a propagated signal that is an artificially generated signal, e.g., a machine-generated electrical, optical, or electromagnetic signal that is generated to encode information for transmission to suitable receiver apparatus for execution by a programmable processor.

The described features related to processing of data can be implemented advantageously in one or more computer programs that are executable on a programmable system including at least one programmable processor coupled to receive data and instructions from, and to transmit data and instructions to, a data storage system, an input device, and an output device. A computer program is a set of instructions that can be used, directly or indirectly, in a computer to perform a certain activity or bring about a certain result. A computer program can be written in any form of programming language (e.g., Fortran, C, C++, Objective-C, Java), including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors or cores, of any kind of computer. For example, the control unit 10 may include one or more such processors that execute instructions for implementing a process for calibrating the position-measuring system. Generally, a processor will receive instructions and data from a read-only memory or a random access memory or both. The elements of a computer include a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a LCD (liquid crystal display) monitor, an electronic ink (E-ink) display, or an organic light emitting diode (OLED) display for displaying information to the user and a keyboard and a pointing device such as a mouse, a trackball, or touchpad by which the user can provide input to the computer. A touch display can also be used in which the display surface is sensitive to touch inputs from a user.

A number of implementations have been described. Nevertheless, it will be understood that various modifications may be made. For example, elements of one or more implementations may be combined, deleted, modified, or supplemented to form further implementations. As yet another example, the logic flows of processes described above do not require the particular order shown, or sequential order, to achieve desirable results. In addition, other steps may be provided, or steps may be eliminated, from the described flows, and other components may be added to, or removed from, the described systems. For example, the measurement patterns can be different from those described above. Accordingly, other implementations are within the scope of the following claims.

The invention claimed is:

1. A method for calibrating a position-measuring system, which has
a measuring area filled with a gaseous medium,
a sample stage for holding a sample, in which the sample stage can be moved at least in one direction and is arranged in the measuring area,
an optical system arranged in the measuring area, in which the system records a held sample and produces corresponding first measuring signals,
a first measuring system which is arranged in the measuring area, measures, by use of interferometry, movement of the sample stage in the at least one direction and produces corresponding second measuring signals,
a second measuring system which measures a change in distance corresponding to a change in pressure of the gaseous medium in the measuring area and produces corresponding third measuring signals, and
an evaluation unit which, based on the first, second and third measuring signals, determines the position of a recorded structure, wherein the third measuring signals serve to reduce a measuring error occurring when the pressure of the gaseous medium changes during interferometric measurement of the movement of the sample stage, the method for calibration comprising:

a) making multiple measurements of positions or dimensions of one or more structures of a sample held by the sample stage at different pressures of the gaseous medium, b) ascertaining a pressure dependence when determining actual positions corresponding to the measured positions by use of an evaluation unit, c) establishing a calibration rule based on the ascertained pressure dependence, and d) applying the calibration rule when determining the actual positions by use of the evaluation unit and/or when producing at least one of the first, second and third measuring signals, in order to reduce the pressure dependence when determining the actual positions.

2. The method according to claim 1, in which in step b) a linear approximation of the measured positions, depending on the pressure, is ascertained as pressure dependence and in step c) as calibration rule there is established a proportionality factor which is determined such that a pressure-induced error is reduced when determining the actual positions.

3. The method according to claim 1, in which the second measuring system is designed as a differential interferometer.

4. The method according to claim 2, in which the second measuring system is designed as a differential interferometer.

5. The method according to claim 1, in which the second measuring system has a measuring section with a constant length through the gaseous medium and, for measuring the change in pressure, detects the interference of a measuring beam passing through the measuring section and a measuring beam not passing through the measuring section.

6. The method according to claim 1, in which the calibration rule arithmetically changes an actual length of the measuring section to be taken into account while determining the change in pressure.

7. The method according to claim 1, in which positions of several structures are measured several times in step a) and a distance between the structures is determined when determining the actual positions in step b).

8. The method according to claim 1, in which the temperature and/or the relative moisture of the gaseous medium is regulated in the measuring area such that a predetermined constant value is maintained.

9. A position-measuring system comprising:

a measuring area filled with a gaseous medium, a sample stage for holding a sample, in which the sample stage can be moved at least in one direction and is arranged in the measuring area, an optical system arranged in the measuring area, in which the optical system records one or more structures of a held sample and produces corresponding first measuring signals, a first measuring system which is arranged in the measuring area, measures, by use of interferometry, movement of the sample stage in the at least one direction and produces corresponding second measuring signals, a second measuring system which measures a change in distance corresponding to a change in pressure of the gaseous medium in the measuring area and produces corresponding third measuring signals, an evaluation unit which, based on the first, second and third measuring signals, determines a position of a recorded structure, wherein the third measuring signals serve to reduce a measuring error occurring when the pressure of the gaseous medium changes during the interferometric measuring of the movement of the sample stage, and a control unit which carries out the following steps:

a) making multiple measurements of positions or dimensions of one or more structures of a sample held by the sample stage at different pressures of the gaseous medium, b) ascertaining a pressure dependence when determining actual positions corresponding to the measured positions by use of an evaluation unit, c) establishing a calibration rule based on the ascertained pressure dependence, and d) applying the calibration rule when determining the actual positions by use of the evaluation unit and/or when producing at least one of the first, second and third measuring signals, in order to reduce the pressure dependence when determining the actual positions.

10. The system of claim 9 in which in step b) a linear approximation of the measured positions, depending on the pressure, is ascertained as pressure dependence and in step c) as calibration rule there is established a proportionality factor which is determined such that a pressure-induced error is reduced when determining the actual positions.

11. The system of claim 10, in which the second measuring system is designed as a differential interferometer.

12. The system of claim 9, in which the second measuring system is designed as a differential interferometer.

13. The system of claim 9, in which the second measuring system has a measuring section with a constant length through the gaseous medium and, for measuring the change in pressure, detects the interference of a measuring beam passing through the measuring section and a measuring beam not passing through the measuring section.

14. The system of claim 9, in which the calibration rule arithmetically changes an actual length of the measuring section to be taken into account while determining the change in pressure.

15. The system of claim 9, in which positions of several structures are measured several times in step a) and a distance between the structures is determined when determining the actual positions in step b).

16. The system of claim 9, in which the temperature and/or the relative moisture of the gaseous medium is regulated in the measuring area such that a predetermined constant value is maintained.

17. A method for calibrating a position-measuring system, the method comprising:

measuring a position of a structure of a first sample held by a sample stage at different pressures of a gaseous medium, the sample stage being positioned within a measuring area filled with the gaseous medium;

determining, using an evaluation unit, a pressure dependence when measuring the position of the structure of the first sample;

determining a calibration rule based on a pressure dependence; and applying, by using the evaluation unit, the calibration rule for determining the actual position of the structure of the first sample or an actual position of a structure of a second sample in order to reduce the pressure dependence when determining the actual position of the structure of the first or second sample;

wherein determining the actual position of the structure of the first or second sample is based on first measuring signals provided by an optical system that records the structure of the first or second sample, second measuring signals provided by a first measuring system arranged in the measuring area and configured to measure movement of the sample stage in at least one direction, third measuring signals provided by a second measuring system configured to measure a change in the distance corresponding to a change in pressure of the gaseous medium in the measuring area, and applying the calibration rule.

18. The method of claim 17, in which applying, by using the evaluation unit, the calibration rule is performed when producing at least one of the first, second, or third measuring signals, in order to reduce the pressure dependence when determining the actual position of the structure of the first or second sample.

19. The method of claim 17 in which determining the pressure dependence comprises determining a linear approximation of the pressure dependence of the measured position of the structure of the first or second sample, and determining the calibration rule comprises determining a proportionality factor such that a pressure-induced error is reduced so as to determine the actual position of the structure of the first or second sample.

* * * * *

UNITED STATES PATENT AND TRADEMARK OFFICE
CERTIFICATE OF CORRECTION

PATENT NO. : 9,528,825 B2  
APPLICATION NO. : 14/327634  
DATED : December 27, 2016  
INVENTOR(S) : Carola Blaesing-Bangert et al.

Page 1 of 1

It is certified that error appears in the above-identified patent and that said Letters Patent is hereby corrected as shown below:

On the Title Page

Column 1, Assignee, Line 1, delete "Zeizz" and insert -- Zeiss --

Signed and Sealed this  
Ninth Day of May, 2017

Michelle K. Lee  
*Director of the United States Patent and Trademark Office*